(12) United States Patent
Chan et al.

(10) Patent No.: US 7,602,615 B2
(45) Date of Patent: Oct. 13, 2009

(54) IN-GRID DECOUPLING FOR BALL GRID ARRAY (BGA) DEVICES

(75) Inventors: Alex Chan, Nepean (CA); Paul James Brown, Wakefield (CA)

(73) Assignee: Alcatel Lucent, Paris (FR)

( * ) Notice: Subject to any disclaimer, the term of this patent is extended or adjusted under 35 U.S.C. 154(b) by 233 days.

(21) Appl. No.: 11/709,891

(22) Filed: Feb. 23, 2007

(65) Prior Publication Data

US 2008/0205011 A1  Aug. 28, 2008

(51) Int. Cl.
H05K 7/10 (2006.01)
(52) U.S. Cl. ..................... 361/767; 174/261
(58) Field of Classification Search ............ 174/261, 174/260, 266; 361/767, 768
See application file for complete search history.

(56) References Cited

U.S. PATENT DOCUMENTS

| | | | |
|---|---|---|---|
| 5,784,262 A * | 7/1998 | Sherman | 361/777 |
| 5,812,378 A * | 9/1998 | Fjelstad et al. | 361/769 |
| 6,271,481 B1 * | 8/2001 | Goenka et al. | 174/261 |
| 6,643,916 B2 * | 11/2003 | Larson | 29/610.1 |
| 6,657,133 B1 * | 12/2003 | Chee | 174/260 |
| 6,845,556 B1 | 1/2005 | Liang | |
| 7,084,353 B1 | 8/2006 | Downes | |
| 2005/0162839 A1 | 7/2005 | Chan et al. | |
| 2006/0166398 A1 | 7/2006 | Chan | |
| 2007/0177364 A1 * | 8/2007 | Larsen et al. | 361/760 |

FOREIGN PATENT DOCUMENTS

| | | |
|---|---|---|
| CN | 101068453 | 11/2007 |
| DE | 3307088 | 9/1984 |
| JP | 10335796 | 12/1998 |

OTHER PUBLICATIONS

Anonymous "Method for soldering capacitor arrays under BGAs to improve decoupling capacitance" IP Com. Journal, IP Com Inc., Jan. 22, 2003, West Henrietta, NY.
Ramkumar et al. "Lead-free 0201 manufacturing, assembly and reliability test results", Microelectronics and Reliability, Elsevier Science Ltd., vol. 46, No. 2-4, Feb. 1, 2007.

* cited by examiner

Primary Examiner—Dean A. Reichard
Assistant Examiner—Yuriy Semenenko

(57) ABSTRACT

A ball grid array (BGA) having an array of BGA pads on one side and at least a pair of contiguous through board vias, at least a pair of conductive pads surrounding the through hole vias, wherein the conductive pads have octagonal shapes and four sides of each octagonal pad are mutually parallel.

7 Claims, 5 Drawing Sheets

IN-GRID DECOUPLING FOR BALL GRID ARRAY (BGA) DEVICES

REFERENCE TO RELATED APPLICATIONS

The present application is related to U.S. patent application Ser. No. 11/041,727 filed Jan. 25, 2005 entitled OFF-GRID DECOUPLING OF BALL GRID ARRAY (BGA) DEVICES AND METHOD.

BACKGROUND AND BRIEF DESCRIPTION OF THE INVENTION

This invention relates to the design of electronic circuit cards. Specifically, it is directed to the problem of electrically decoupling a BGA device with surface mount capacitors placed on the opposite side of the circuit card with respect to the BGA device and within the grid of vias and contacts used to route signal traces to and from the BGA device.

A number of solutions have been previously developed. These solutions targeted at solving decoupling issues on 1.00 mm pitch BGA devices. However these solutions are not applicable to finer pitch BGA devices (<1.00 mm). Increasing design densities and component miniaturization trends are making the use of 0.8 mm BGAs more common on many designs.

Referring to FIGS. 1A-1C, this prior art approach uses shared vias on power SP and ground SG connections aligned in columns, in order to form a routing channel (i.e. a larger space between the row of shared vias SV and an adjacent row) through which connections can be routed. This is not a decoupling solution, however the assignee hereof has filed a patent application on a solution that makes use of the shared via SV concept. That patent application is U.S. Ser. No. 10/761,343 entitled "Shared Via Decoupling for Area Arrays Components" and was filed on Jan. 22, 2004 and is incorporated herein by reference. FIG. 1C illustrates an example of this "shared-via" decoupling technique. The main drawback of the shared-via solution is that it is not always possible to share vias even though there are alternating power and ground rows. For example, in some cases the combined transient current of two power supply balls may exceed the limit for a via, in which case the two balls cannot share a via, and consequently the shared-via decoupling technique for those balls cannot be used.

Referring to prior art FIG. 2, the off-grid decoupling solution required to shift the grid of the vias in the 1 mm pitch BGA device in order to create space to allow the 0402 capacitor PC to fit into the space. Such technique will not be able to apply to a 0.8 mm pitch device without violating the spacing requirement between conductive features.

The object of the present invention is to provide a novel decoupling solution that seeks to address decoupling of sub-1 mm pitch BGAs (specifically, devices with a pitch of 0.8 mm×1 mm and 0.8 mm×0.8 mm).

This invention uses octagonal land patterns in combination with specifically filled vias underneath fine pitch BGA devices for decoupling applications.

The focus of this solution is to provide decoupling for 0.8 mm×0.8 mm pitch and 0.8 mm×1 mm pitch fine pitch BGA devices.

The idea of merging the use of new PCB technology with a novel land pattern design will allow the population of capacitors directly underneath fine pitch BGA devices, something which was not possible previously.

BRIEF DESCRIPTION OF THE DRAWINGS

The above and other objects, advantages and features of the invention will become more apparent when considered in conjunction with the following specification and attached drawings wherein.

DETAILED DESCRIPTION OF THE INVENTION

The invention introduces the use of a shaped pad, preferably an octagonal shaped pad for mounting a 0402 discrete passive device (e.g. 0.040×0.020" decoupling capacitor) in the tightly confined space available underneath a sub-1 mm pitch BGA. In addition to the octagonal shape of the pad, filled via technology is used under the pad to gain the benefits of through hole vias in these locations.

In a normal application, a pad used to mount a 0402 device is rectangular. However, in order to adhere to tight spacing requirements between conductive features under the BGA, and to maximize the surface area needed for a reliable solder joint, according to the invention, a specifically designed octagonal pad is used.

Figure 1A:
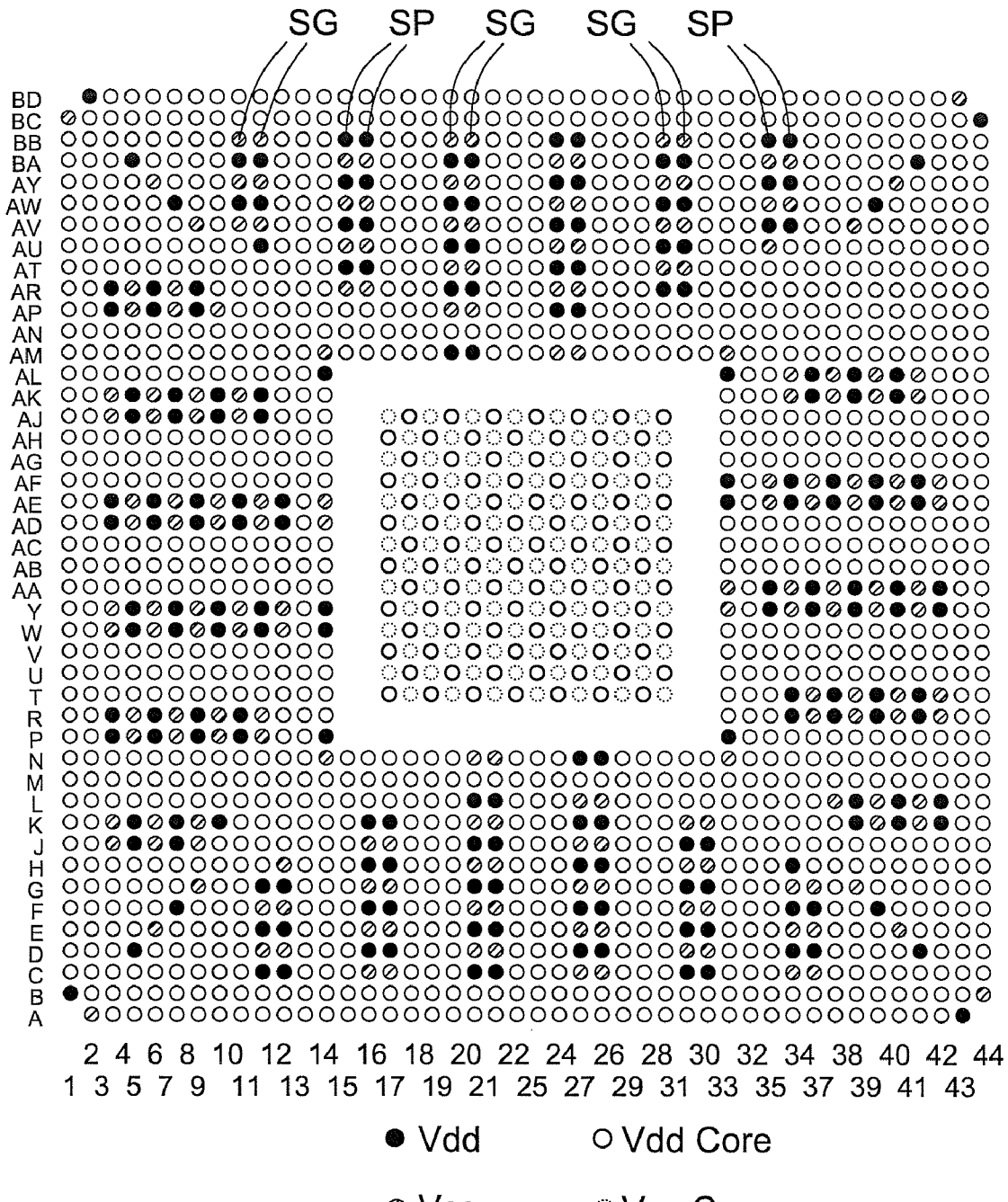
FIGS. 1A, 1B and 1C illustrate one prior art solution disclosed in U.S. application Ser. No. 11/041,727 incorporated herein by reference.
Figure 1B:
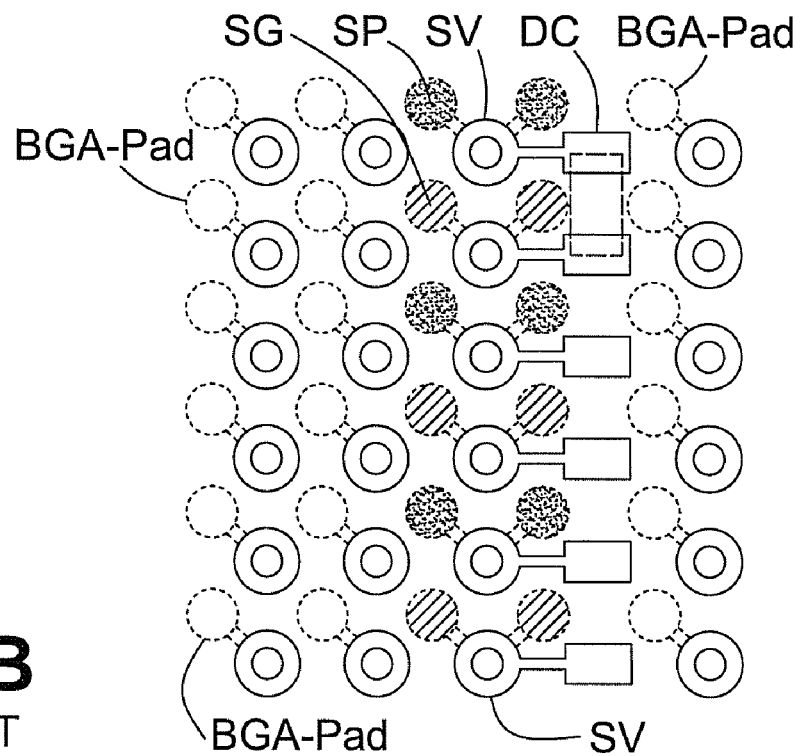
Figure 1C:
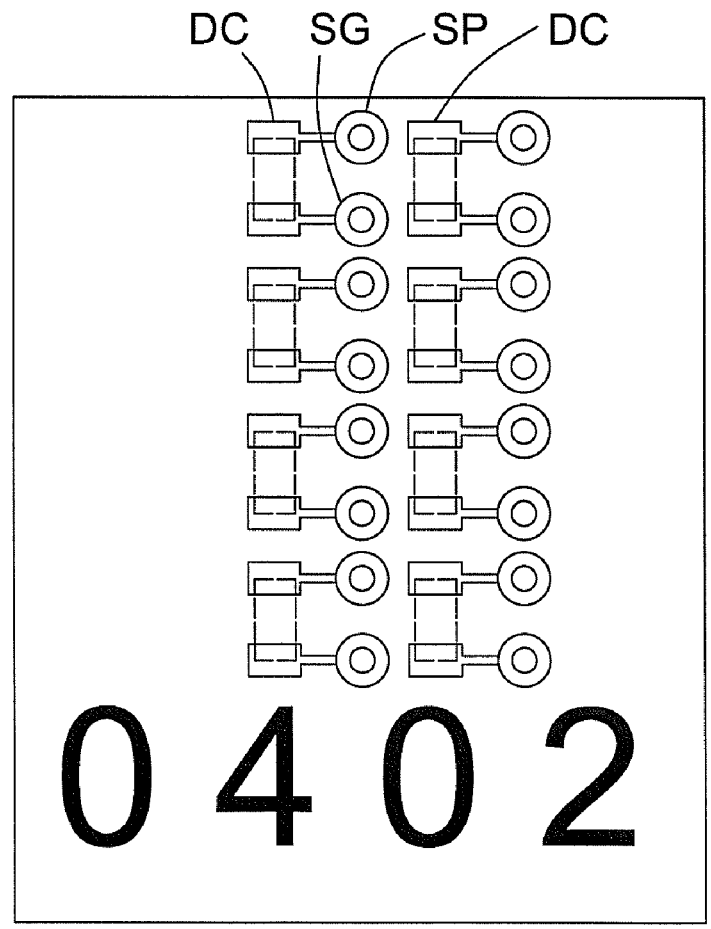
Figure 2:
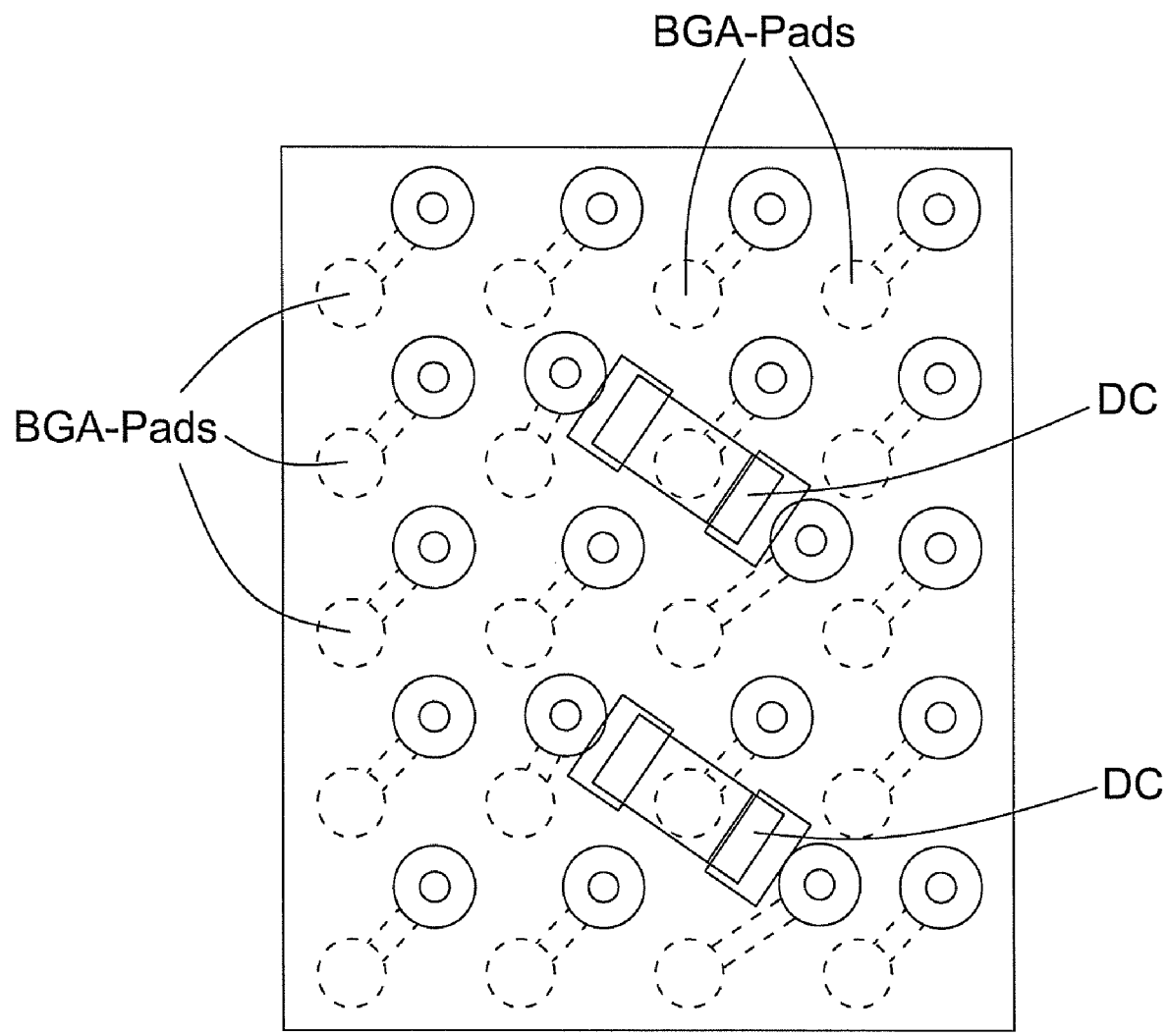
FIG. 2 is another illustration of prior art from U.S. Ser. No. 11/041,727.
Figure 3:
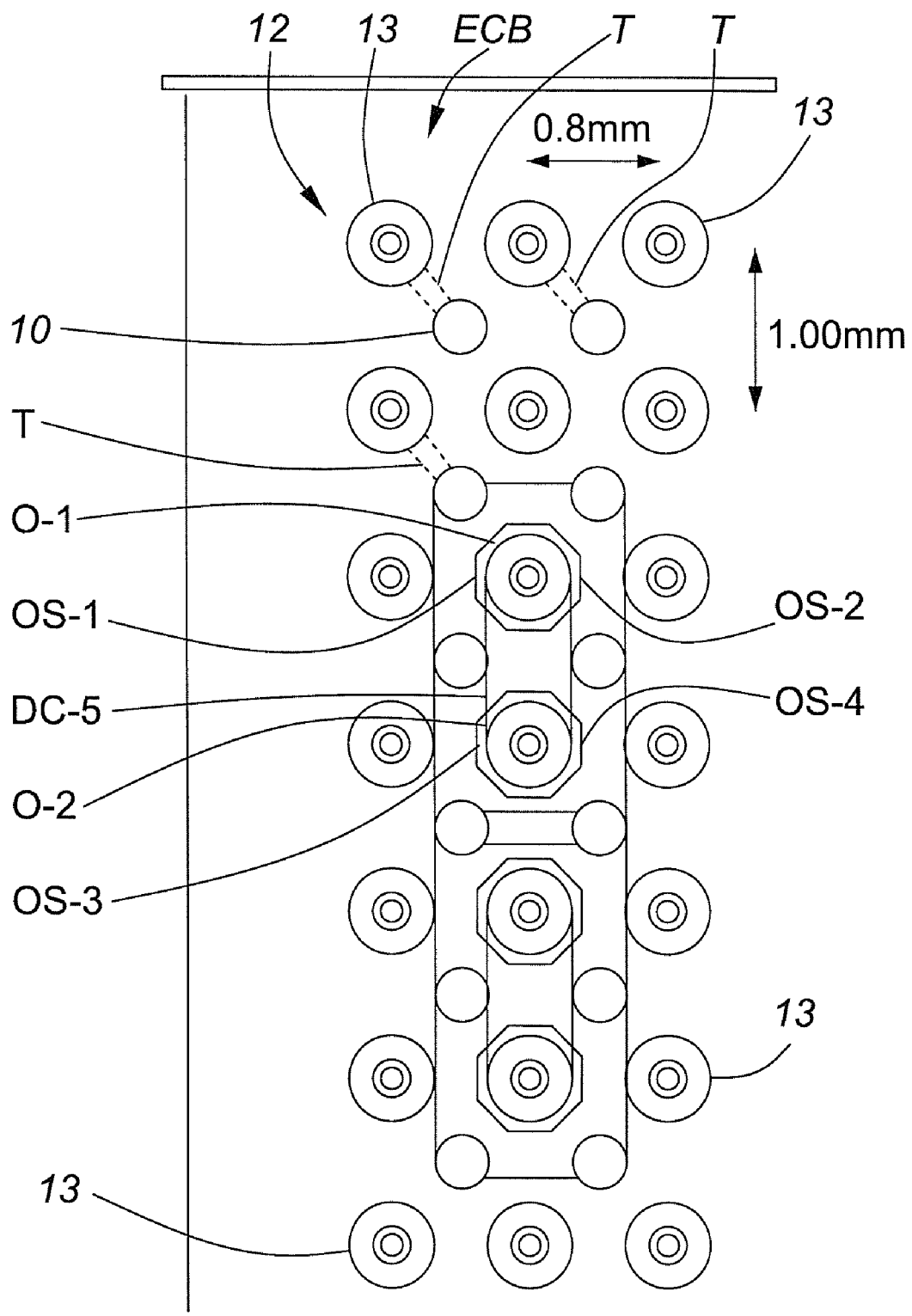
FIG. 3 illustrates a first embodiment of the invention.

Referring to FIG. 3, an electronic circuit board ECB has an array of BGA pads 10. The BGA pads 10 only appear on the opposite side of where the decoupling capacitors DC would be placed. Pads and vias are connected by a conductive trace T (only upper two in array 10 shown in FIGS. 3 and 4). The ECB has an array 12 of via pads 13 on the non-BGA grid side. The via 13 pads go through the ECB with the hole being filled with conductive or non-conductive materials.

Figure 4:
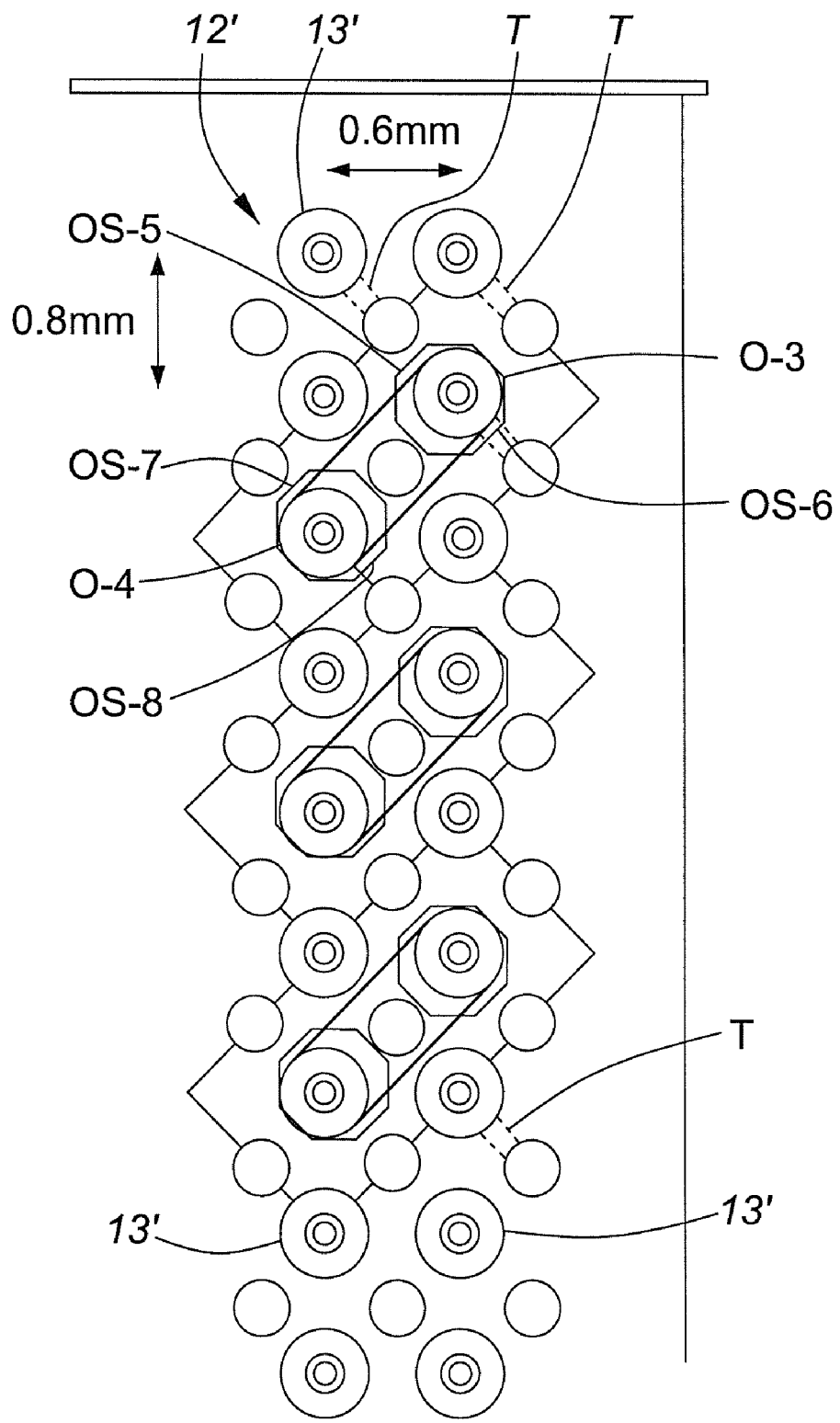
FIG. 4 illustrates the second embodiment of the invention.

The octagonal land pattern in contiguous rows or columns are oriented so that opposing side pairs of the octagonal land pattern are parallel as shown in FIGS. 3 and 4. The octagonal pad O-1, side OS-1, and opposite side OS-2 are parallel to octagonal pad O-2, side OS-3, and side pair OS-4 are mutually parallel. Likewise, as shown in FIG. 4, the octagonal land pad O-3, side OS-5, OS-6 and octagonal pad O-4 has its side pair OS-7, OS-8 mutually parallel to the side pair OS-7 and OS-8 of octagonal land pad O-4. In FIG. 3, the decoupling capacitor DC-5 is mounted parallel to the side pair OS-1, OS-2, OS-3, OS-4.

The result of using the new octagonal pad design and filled via technology, is that an 0402 device can be successfully mounted on a 0.8 mm×1 mm grid BGA (common standard for DRAM like DDR2) or that of a true 0.8 mm×0.8 mm pitch BGA. Because of the pitch differences, the exact solution varies slightly between these two embodiments; where the 0.8 mm×1 mm pitch BGA would require a vertical placement of 0402 and the 0.8 mm×0.8 mm device would require a 45 degree diagonal 0402 placement.

Not only does the above solution further help with the densification of the design by tucking the decoupling and termination passives (0402s) directly underneath the BGA, it also ensures that the electrical performance of these decoupling and termination devices are maximized by minimizing the distance from BGA ball to passive device lead.

ADVANTAGES OF THE INVENTION

1. This solution allows decoupling capacitors to be placed underneath a 0.8 mm×1 mm or 0.8 mm×0.8 mm pitch BGA device, something that is otherwise not possible.
2. Improved signal integrity by a significant reduction of the distance between BGA and decoupling/termination device (when compared to what is currently possible).
3. Space saving on the design due to the removal of the decoupling device which would otherwise occupy valuable design real estate outside of the BGA grid.

As the trend of miniaturization continues, the use of 0.8 mm pitch like BGA technology will increase. The invention would be of benefit to many designs and would especially be of interest to those in the high speed/high density applications.

While the invention has been described in relation to preferred embodiments of the invention, it will be appreciated that other embodiments, adaptations and modifications of the invention will be apparent to those skilled in the art.

What is claimed is:

1. An electronic circuit board (ECB) comprising:
    a ball grid array (BGA) of BGA pads on one side of the ECB, arranged in a grid pattern of rows and columns;
    through hole vias extending from said one side of the ECB to an opposite side of the ECB, and wherein at least one contiguous pair of said through hole vias are filled with a conductor, and wherein each of said though hole vias of said contiguous pair is offset from a corresponding one of said BGA pads and connected to said corresponding BGA pad by a conductor on said one side;
    a contiguous pair of octagonal conductive pads on the opposite side of the ECB, each pad of said pair of octagonal conductive pads arranged above, aligned with and connected to a corresponding one of said contiguous pair of through hole vias; and
    a two-port device mounted directly on said pair of octagonal conductive pads, in a given alignment with the grid pattern, wherein said contiguous pair octagonal conductive pads have respective sides aligned in a given alignment with the grid pattern.

2. The ECB of claim 1 wherein said contiguous pair of orthogonal pads have four mutually parallel sides, respectively.

3. The ECB of claim 1 wherein said contiguous pair of octagonal pads are arranged in a direction aligned to the grid pattern of the BGA pads.

4. The ECB of claim 1 wherein said contiguous pair of octagonal pads are arranged in a direction having diagonal alignment with the grid pattern of the BGA pads.

5. The ECB of claim 1 wherein said two-port device is a decoupling capacitor.

6. A computer aided design tool for accommodating a two-port device in a 0.8 mm×1 mm or a 0.8 mm×0.8 mm pitch ball grid array (BGA) electronic circuit board (ECB) comprising:
    a design tool mode to identify, in an ECB configuration of BGA pads in a grid pattern on one side of the ECB and through hole vias adjacent to the BGA pads, each of the through holes vias connected to a corresponding BGA pad by a corresponding trace on said one side of the ECB, at least one pad pair for forming directly on, and aligned with, a corresponding pair of contiguous ones of said through hole vias, said pad pair for directly mounting of and connection to a corresponding one of said two port devices; and
    a design tool mode to configure said pad pairs to have an octagonal configuration that configures said pair of octagonal pads to have four mutually parallel sides.

7. The computer aided design tool of claim 6, wherein said design tool mode to configure said pad pairs to have an octagonal configuration that configures said pair of octagonal pads to have four mutually parallel sides configures adjacent ones of said pad pairs to meet a given minimum spacing and to directly support and connect to corresponding adjacent ones of said two port devices in a substantially abutting arrangement.

* * * * *